United States Patent [19]

Seevinck et al.

[11] Patent Number: 4,980,650
[45] Date of Patent: Dec. 25, 1990

[54] CURRENT AMPLIFIER

[75] Inventors: Evert Seevinck, Eindhoven; Remco J. Wiegerink, Enschede, both of Netherlands

[73] Assignee: U.S. Philips Corporation, New York, N.Y.

[21] Appl. No.: 392,635

[22] Filed: Aug. 11, 1989

[30] Foreign Application Priority Data

Aug. 19, 1988 [NL] Netherlands .................. 8802057

[51] Int. Cl.$^5$ .............................................. H03F 3/04
[52] U.S. Cl. ..................................... 330/288; 323/315
[58] Field of Search ................. 330/288; 307/296.6; 323/315, 316

[56] References Cited

U.S. PATENT DOCUMENTS 3,829,789  8/1974  Mulder .............................. 330/289
4,771,227  9/1988  Nelson .............................. 323/315

OTHER PUBLICATIONS

Van Kessel, "A New Bipolar Reference Current Source", IEEE Journal of Solid–State Circuits, vol. SC-21, No. 4, Aug. 1986, pp. 561–567.

Primary Examiner—James B. Mullins
Attorney, Agent, or Firm—Bernard Franzblau

[57] ABSTRACT

A current amplifier has an input terminal (1) for receiving an input current and an output terminal (2) for supplying an output current. A first transistor ($T_1$) has a base-emitter junction coupled to the input terminal and a second transistor ($T_2$) has a collector coupled to the output terminal and an emitter arranged in series with a voltage source (4). The series arrangement of the voltage source and the base-emitter junction of the second transistor is arranged in parallel with the base-emitter junction of the first transistor. The first transistor is of the NPN conductivity type and the second transistor is of the PNP conductivity type. The low internal series resistance of the NPN transistor $T_1$ develops a relatively small voltage drop so that the attenuated output current ($I_{out}$) is a linear function of the input current over a wide range of input currents. This results in a current-sourcing attenuating current mirror having a far better linearity than a current amplifier in which the first and second transistors are both of the PNP conductivity type.

12 Claims, 5 Drawing Sheets

CURRENT AMPLIFIER

BACKGROUND OF THE INVENTION

This invention relates to a current amplifier comprising an input terminal for receiving an input current, an output terminal for supplying an output current, a first transistor having a base-emitter junction coupled to the input terminal, and a second transistor having a collector coupled to the output terminal and having a base-emitter junction which, in series with a voltage source, is arranged in parallel with the base-emitter junction of the first transistor.

Such a current amplifier is used as an attenuating current mirror in which the ratio between the output current and the input current is very small. Such an amplifier is capable of realising attenuation factors of ten times up to a million times.

A current amplifier of the type defined in the opening paragraph is known from U.S. Pat. No. 3,829,789. In this known amplifier the ratio between the output current and the input current is determined by the value of the voltage of a voltage source arranged in series with the emitter of the second transistor. In this arrangement the first and the second transistor are of the same conductivity type. Although only transistors of the NPN conductivity type are shown, the circuits could also be constructed by means of transistors of the PNP conductivity type. If the first and the second transistor are of the NPN conductivity type the input current and the output current will both flow into the current amplifier. The current amplifier then behaves as a current-sinking attenuating current mirror. If the first and the second transistor are of the PNP conductivity type the input and output currents will both flow out of the current amplifier so that the amplifier now behaves as a current-sourcing attenuating current mirror.

In integrated circuits PNP transistors present a substantially higher series resistance than NPN transistors of comparable dimensions. Even for comparatively small currents this causes the voltage drop across a PNP diode or a diode-connected PNP transistor to increase to a greater extent than anticipated on the basis of the well-known diode equation which defines the relationship between the diode current and the diode voltage. In the PNP version of the known current amplifier the series resistance has an adverse effect on the operation of the circuit. Since the voltage drop across the diode-connected first transistor increases excessively as the input current increases, the output current will increase to a more than proportional extent. Consequently, the current transfer of the amplifier will be non-linear. This problem does not occur or hardly occurs, in the NPN version of the known current amplifier. The current transfer is substantially linear for comparable input and output currents. However, since the NPN version can only sink input and output currents its use is limited.

SUMMARY OF THE INVENTION

It is an object of the invention to provide a current amplifier which behaves as a current-sourcing attenuating current mirror having a substantially linear current transfer. To this end a current amplifier of the type defined in the opening paragraph is characterized in that the first transistor is of the NPN conductivity type and the second transistor is of the PNP conductivity type. The input current now flows through a diode-connected NPN transistor which has a substantially lower series resistance than a PNP transistor. Thus, the non-linearity produced by the voltage drop across this series resistance is reduced substantially.

The ratio between the output current and the input current is dictated by the value of the voltage of the voltage source arranged in series with the emitter of the second transistor. From the afore-mentioned United States Patent it is further known that for a substantially temperature-independent transfer the voltage value of the voltage source must be proportional to the absolute temperature. However, this requirement is met only if the first and the second transistor are of the same conductivity type. In the present case in which the first transistor is of the NPN type and the second transistor is of the PNP type, the transfer is also influenced by the different characteristics of the NPN and the PNP transistor. However, the voltage of the voltage source can be corrected for this. To this end the current amplifier in accordance with the invention may be characterized further in that the voltage source comprises a first current mirror circuit having an input terminal for the passage of an input current, an output terminal for the passage of an output current, and a common terminal, the ratio between the output current and the input current of said first current mirror circuit being substantially equal to N, and further comprises a resistor for supplying the output voltage of the voltage source. A series arrangement of a diode-connected third transistor of the NPN conductivity type and the base-emitter junction of a fourth transistor of the PNP conductivity type is arranged in parallel with said resistor. The fourth transistor has an emitter area which is substantially M times as large as that of the second transistor. The emitter of the third transistor being coupled to the base of the fourth transistor and to the output terminal of the first current mirror circuit, which has its input terminal coupled to the collector of the fourth transistor. The emitter area of the first transistor is substantially K times as large as that of the third transistor. A voltage source arrangement of this construction supplies a voltage which is not only proportional to the absolute temperature but which also provides a correction for the inequality between PNP and NPN transistors. By selecting the current gain factor of the first current mirror circuit in the voltage-source arrangement to be equal to N, selecting the ratio between the emitter area of the fourth transistor and the second transistor to be M and in addition making the emitter area of the first transistor K times as large as that of the third transistor, it is achieved that the ratio between the output current and the input current is equal to the reciprocal of the product of K, M and N.

An embodiment of a current amplifier in accordance with the invention is characterized further in that the first current mirror circuit comprises a fifth and a sixth transistor, each of the NPN conductivity type, which fifth transistor has an emitter area which is substantially N times as large as that of the sixth transistor, the base-emitter junctions of the fifth and the sixth transistor being arranged in parallel, the collector-emitter path of the fifth transistor being arranged between the output terminal of the first current mirror circuit and the common terminal of the first current mirror circuit, and the collector-emitter path of the sixth transistor being arranged between the input terminal of the first current mirror circuit and the common terminal of the first current mirror circuit. In this embodiment the first current mirror circuit comprises two NPN transistors whose emitter areas are in a ratio of 1:N to each other. As a result the ratio between the output current and the input current of the current amplifier is determined exclusively by the ratios (K, M, N) between the dimensions of the transistors. Since these ratios can be realised very accurately, this enables the current ratio of the current amplifier to be defined very precisely.

In practice the ratios K, M and N cannot be made indefinitely large so that the maximum attainable current attenuation is limited. An even higher current attenuation can be achieved if the current amplifier in accordance with the invention is characterized further in that the voltage source further comprises a second current mirror circuit having an input terminal for the passage of an input current, an output terminal for the passage of an output current and a common terminal, the ratio between the output current and the input current of said second current mirror circuit being substantially equal to P. The input terminal of the second current mirror circuit is coupled to the common terminal of the first current mirror circuit and the output terminal of the second mirror circuit is coupled to the emitter of the third transistor. By the addition of the second current mirror circuit having a current gain factor P, the ratio between the output current and the input current of the current amplifier becomes equal to the reciprocal of K.M.(P.(N+1)+N). The second current mirror circuit can be of a similar construction to that of the first one so that again the ratio between the input current and the output current of the current amplifier is defined exclusively by the ratios between the transistor dimensions.

A balanced embodiment of a current amplifier in accordance with the invention may be characterized in that it comprises a second current amplifier identical to the first one, the two current amplifiers having a common voltage source.

BRIEF DESCRIPTION OF THE DRAWINGS

The invention will now be described in more detail, by way of example, with reference to the accompanying drawings, in which.

DESCRIPTION OF THE PREFERRED EMBODIMENTS

Figure 1A:
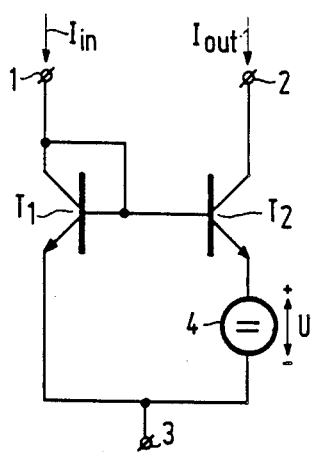
FIGS. 1a and 1b show known current amplifiers.
Figure 1B:
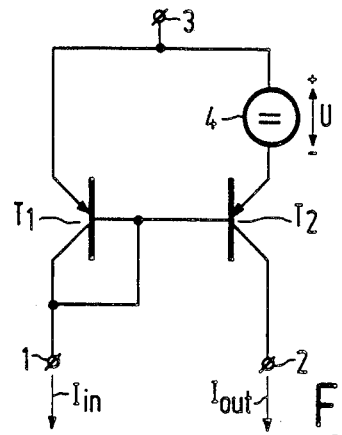

FIG. 1 shows two versions of a known type of current amplifier in which the output current $I_{out}$ can be substantially smaller than the input current $I_{in}$. Such a current amplifier behaves as an attenuating current mirror. FIG. 1a shows the version comprising NPN transistors and FIG. 1b shows the version comprising PNP transistors. The current amplifier comprises a diode-connected first transistor $T_1$ and a second transistor $T_2$ whose emitter is arranged in series with a voltage source 4. The voltage source is a device which develops a given voltage across its terminals independently of any current flowing through the series connected transistor $T_2$. The series arrangement of the base-emitter junction of the transistor $T_2$ and the voltage source 4 is connected in parallel with the base-emitter junction of the transistor $T_1$. The input current $I_{in}$ flows through the input terminal 1, which is coupled to collector-base junction point of the transistor $T_1$. The output current $I_{out}$ flows through the output terminal 2, which is coupled to the collector of the transistor $T_2$. The emitter of the transistor $T_1$ and the voltage source 4 are both connected to a common terminal 3, to which a suitable potential is applied. In the NPN version the input current $I_{in}$ and the output current $I_{out}$ reach the current amplifier via the terminals 1 and 2 respectively and together leave the amplifier via the common terminal 3. Consequently, this arrangement constitutes a current-sinking attenuating current mirror. In the PNP version the input current $I_{in}$ and the output current $I_{out}$ leave the current amplifier via the terminals 1 and 2 respectively, and together they enter the amplifier via the common termial 3. Consequently, this circuit acts as a current-sourcing attenuating current mirror.

The base-emitter voltage VBE of a transistor is related to the collector current I in accordance with the well known equation:

$$VBE = VT^* \ln (I/I_s) \tag{1}$$

where:
VT=(k*T)/q=the thermal voltage,
$I_s$=the saturation current of the transistor,
k=Boltzmann's constant,
q=the elementary change,
T=the absolute temperature.

The arrangements shown in FIG. 1 comply with:

$$VBE_1 = VBE_2 + U \tag{2}$$

where $VBE_1$ and $VBE_2$ are the base-emitter voltages of the transistors $T_1$ and $T_2$ and U is the voltage of the voltage source 4.

If the small base currents are ignored and equation (1) is inserted in equation (2) this yields:

$$VT \ln (I_{in}/I_{s1}) = VT \ln (I_{out}/I_{s2}) + U \tag{3}$$

where $I_{s1}$ and $I_{s2}$ are the saturation currents of the transistors $T_1$ and $T_2$ respectively. If the transistors $T_1$ and $T_2$ are identical equation (3) may be reduced to:

$$U = VT \ln (I_{in}/I_{out}) = -VT \ln (I_{out}/I_{in}) \tag{4}$$

It follows that for a temperature-independent current transfer $I_{out}/I_{in}$ the voltage U of the voltage source 4 must be proportional to the absolute temperature. The voltage U is selected in such a way that the current transfer $I_{out}/I_{in}$ has the desired value.

Figure 2A:
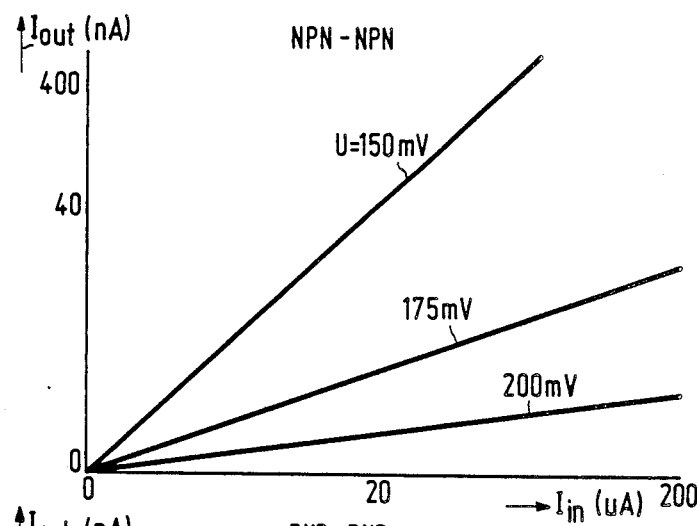
FIGS. 2a and 2b show the current transfer function of the known current amplifiers shown in FIG. 1.
Figure 2B:
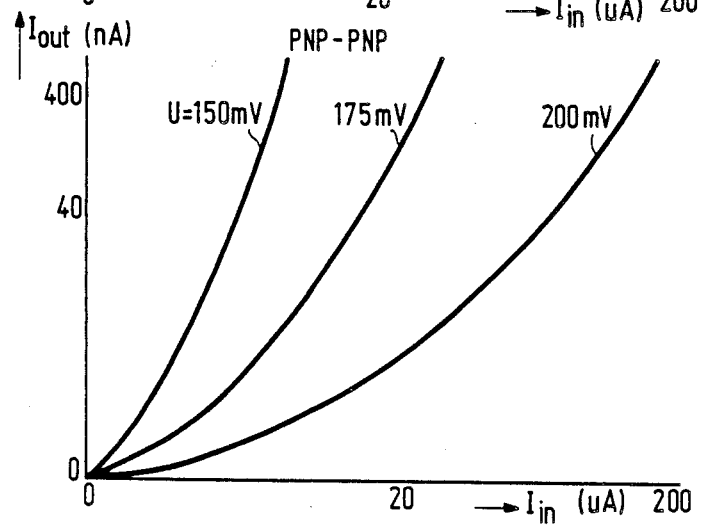

FIGS. 2a and 2b show the current transfer of the two arrangements of FIGS. 1a and 1b in an integrated circuit for a voltage U=150, 175 and 200 mV. In the transfer characteristic of the integrated NPN version, as shown in FIG. 2a, the output current $I_{out}$ is found to increase as a substantially linear function of the input current $I_{in}$, whereas in the integrated PNP version whose transfer characteristic is illustrated in FIG. 2b, the output current $I_{out}$ is found to increase as a more than proportional function of the input current $I_{in}$. This is caused by the comparatively high series resistance of integrated PNP transistors in comparison with integrated NPN transistors of comparable dimensions. On account of this series resistance which may be thought to be in series with the emitter of the relevant transistor, the input current $I_{in}$ produces an additional voltage drop across the diode-connected transistor $T_1$. This additional voltage also appears across the base-emitter junction of the transistor $T_2$ so that the current through this transistor will be larger than anticipated on the basis of equation (4). Consequently, the PNP version of the current amplifier shown in FIG. 1 is less suitable as an attenuating current mirror in integrated circuits on account of the non-linear current transfer. However, the design of an integrated circuit does not always permit the current-sinking NPN version of the current amplifier to be selected.

Figure 3A:
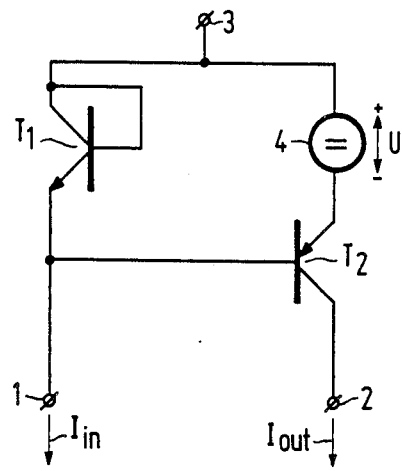
FIG. 3a shows a current amplifier in accordance with the invention.
Figure 3B:
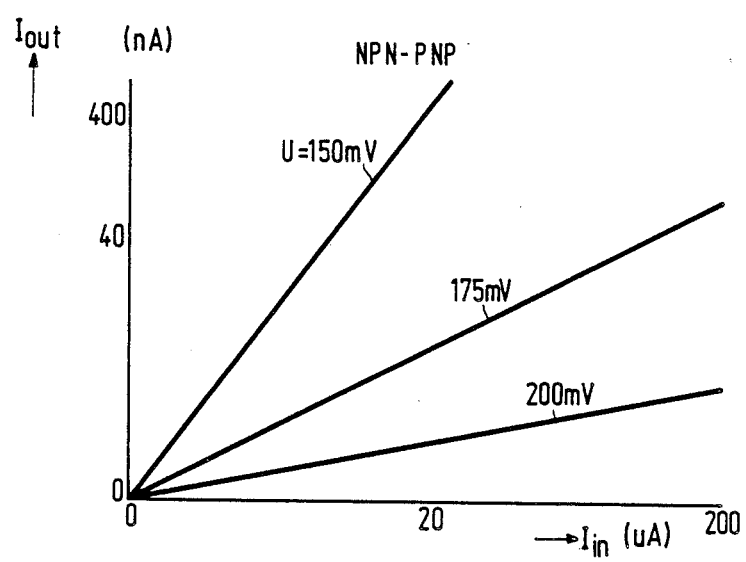
FIG. 3b shows the current transfer function of a current amplifier in accordance with the invention.

FIG. 3a shows a current amplifier in accordance with the invention. The references in this Figure have the same meaning as in FIG. 1. In this current amplifier the diode-connected first transistor $T_1$ is of the NPN conductivity type and the second transistor $T_2$ is of the PNP conductivity type. The emitter of the transistor $T_1$ is connected to the base of the transistor $T_2$ and is coupled to the input terminal 1. The collector-base junction point of the transistor $T_1$ is connected to the common terminal 3. The collector of the transistor $T_2$ is coupled to the output terminal 2. The voltage source 4 is again arranged in series with the emitter of the transistor $T_2$. The voltage source 4 is connected to the common terminal 3 so that the series arrangement of the base-emitter junction of the transistor $T_2$ and the voltage source 4 is connected in parallel with the base-emitter junction of the transistor $T_1$. The input current $I_{in}$ now flows through an NPN transistor having a substantially lower series resistance so that the additional voltage drop across this resistance is now negligible. For comparable input and output currents the arrangement in accordance with the invention shown in FIG. 3a has a far better linearity than the known arrangement of FIG. 1b, as will be apparent from the current transfer function of the arrangement in accordance with the invention as shown in FIG. 3b. In the current amplifier shown in FIG. 3a the transistors are of different conductivity types so that equation (4) is no longer valid. Equation (3) may be rewritten as:

$$U = -VT \ln (I_{out}/I_{in} \cdot I_{sp}/I_{sn}) \tag{5}$$

where $I_{sp}$ is the saturation current of PNP transistor and $I_{sn}$ is the saturation current of an NPN transistor. In order to ensure that the current transfer $I_{out}/I_{in}$ once selected remains as constant as possible, the voltage source U should not only be proportional to the absolute temperature but should also include a correction factor to allow for the difference in saturation current of an PNP transistor and that of a NPN transistor.

Figure 4A:
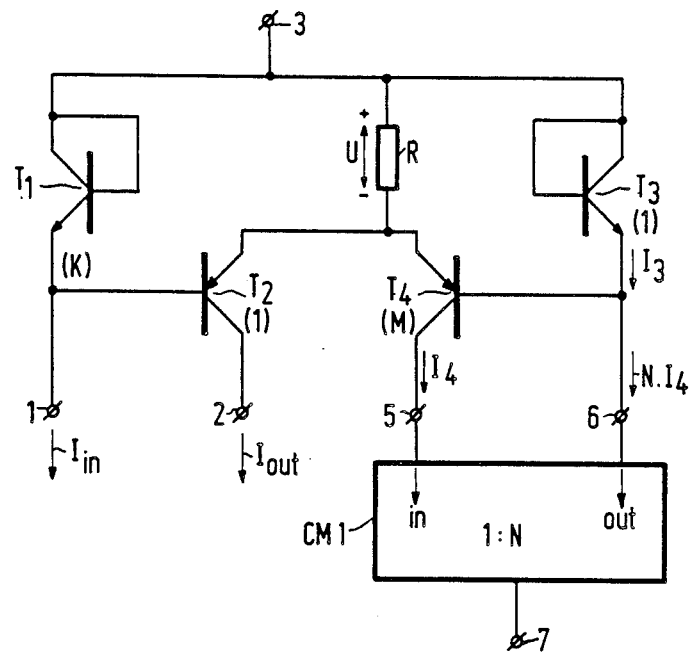
FIGS. 4a, 4b and 4c show a first embodiment of a current amplifier in accordance with the invention.

FIG. 4a shows the current amplifier of FIG. 3a provided with a voltage source which meets the above requirements. In this Figure corresponding parts bear the same reference numerals as in FIG. 3. The voltage source in accordance with the invention comprises a resistor R, a PNP transistor $T_4$, a diode-connected NPN transistor $T_3$, and a first current mirror circuit CM1. The voltage drop across the resistor R is the voltage U. It is assumed that the voltage drop produced across the resistor R by $I_{out}$ is smaller than the desired value of the voltage U across the resistor R. The emitter of the transistor $T_2$ is connected to the common terminal 3 via the resistor R. The emitter of the transistor $T_2$ is also connected to the emitter of a PNP transistor $T_4$. A diode-connected NPN transistor $T_3$ is connected in parallel with the series arrangement of the resistor R and the base-emitter junction of the transistor $T_4$. The collector-base junction point of the transistor $T_3$ is connected to the common terminal 3 and the emitter of the transistor $T_3$ is connected to the base of the transistor $T_4$. The collector of the transistor $T_4$ is coupled to the input terminal 5 of the first current mirror circuit CM1. The emitter of the transistor $T_3$ is coupled to the output terminal 6 of the current mirror circuit CM1, which further comprises a common terminal 7 coupled to a suitable voltage in a manner not shown. The current mirror circuit CM1 has a current gain N, i.e. the current in the output terminal is N times as large as the current in the input terminal 5. Moreover, the relative emitter area of each transistor with respect to a reference transistor of the same conductivity type is given in brackets in FIG. 4. The transistor $T_2$ constitutes a PNP reference transistor and the transistor $T_3$ constitutes the NPN reference transistor. The NPN transistor $T_1$ consequently has an emitter area which is K times as large as that of the NPN reference transistor $T_3$ and the PNP transistor $T_4$ has an emitter area which is M times as large as that of the PNP reference transistor $T_2$. The saturation current of a transistor is proportional to its emitter area. For example, the PNP transistors $T_2$ and $T_4$ therefore comply with:

$$I_{sp4} = M \cdot I_{sp2}.$$

A similar relationship can be found for the other transistors. The current through the transistor $T_4$ is $I_4$ and that through the transistor $T_3$ is $I_3$. The current mirror circuit CM1 amplifies the current $I_4$ N times, so that $I_3 = N \cdot I_4$. The following equation is now valid:

$$U + VBE_4 = VBE_3 \tag{6}$$

where $VBE_4$ and $VBE_3$ are the base-emitter voltages of the transistors $T_4$ and $T_3$. Considering the foregoing, and using equation (1) yields:

$$U + VT \ln (I_4(M \cdot I_{sp})) = VT \ln (N \cdot I_4/I_{sn}) \tag{7}$$

This can be reduced to:

$$U = VT \ln (M \cdot N \cdot I_{sp}/I_{sn}) \tag{8}$$

The voltage is proportional to the absolute temperature and contains a correction factor for the difference in the saturation currents of PNP and NPN transistors.

Now the currents transfer $I_{out}/I_{in}$ for the transistors $T_1$ and $T_2$ can be calculated:

$$VBE_1 = VBE_2 + U \tag{9}$$

$$VT \ln (I_{in}(K \cdot I_{sn})) = VT \ln (I_{out}/I_{sp}) + + VT \ln (M \cdot N \cdot I_{sp}/I_{sn}) \tag{10}$$

It follows from (10) that:

$$\ln (I_{out}/I_{sp}) + \ln(K \cdot I_{sn}/I_{in}) + + \ln(M \cdot N \cdot I_{sp}/I_{sn}) = 0 \tag{11}$$

yielding:

$$(I_{out}/I_{in}) \cdot K \cdot M \cdot N = 1 \tag{12}$$

or:

$$I_{out}/I_{in} = 1/(K.M.N) \quad (13)$$

Figure 4B:
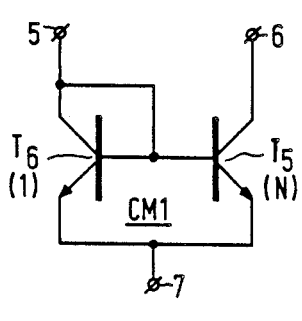
Figure 4C:
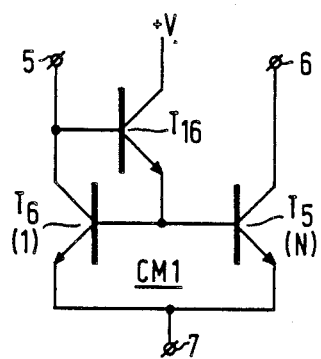

FIGS. 4b and 4c show embodiments, known per se, of a current mirror circuit having a current gain N. Both embodiments comprise two NPN transistors $T_5$ and $T_6$ whose base-emitter junctions are arranged in parallel. The emitters of the transistors $T_5$ and $T_6$ are coupled to the common terminal 7, the collector of the transistor $T_5$ is coupled to the output terminal 6 and the collector of the transistor $T_6$ is coupled to the input terminal 5. The transistor $T_6$ is connected as a diode, the voltage difference between the collector and the base of the transistor $T_6$ being maintained constant by a short-circuit in the arrangement shown in FIG. 4b and by a transistor $T_{16}$ operating as a voltage follower in the arrangement shown in FIG. 4c. The emitter area of the transistor $T_5$ is N times as large as that of the transistor $T_6$ so that the current in the output terminal 6 is N times as large as the current in the input terminal 5. Thus it is achieved that the current transfer $I_{out}/I_{in}$ of the current amplifier shown in FIG. 4 is dictated exclusively by the ratios (K, M and N) between the dimensions of the transistors which are used. The temperature and the inevitable spread in saturation currents do not play a part.

Figure 5A:
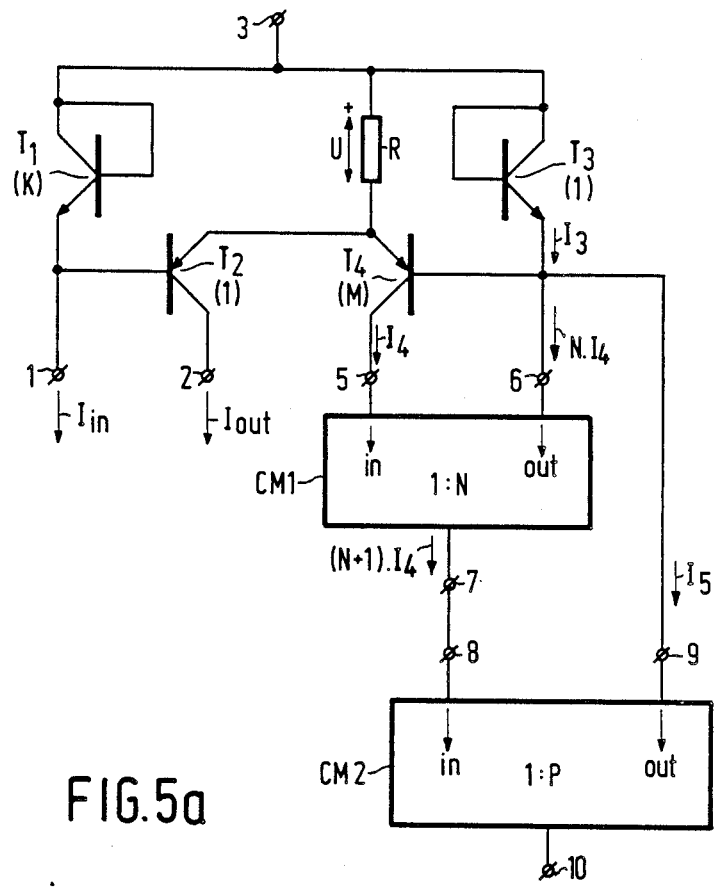
FIGS. 5a, 5b and 5c show a second embodiment of a current amplifier in accordance with the invention.

In practice, the ratios K, M and N cannot be selected arbitrarily large. Therefore, the attainable current gain K.M.N. is limited. FIG. 5 shows a current amplifier in accordance with the invention which enables an even higher attenuation to be achieved. In this Figure identical parts bear the same reference numerals as in FIG. 4. A second current mirror circuit CM2 has been added. The input terminal 8 of this current mirror circuit is coupled to the common terminal 7 of the first current mirror circuit CM1. The output terminal 9 is coupled to the emitter of the transistor $T_3$, while the common terminal 10 is coupled to a suitable potential in a manner not shown. The current mirror circuit CM2 has a current gain P. The current $I_3$ is split into a current $N.I_4$ and a current $I_5$, so that:

$$I_3 = N.I_4 + I_5 \quad (14)$$

The current in the input terminal 8 of the current mirror circuit CM2 is equal to the sum of the input current $I_4$ and the output current $N.I_4$ of the first current mirror circuit CM1, i.e. $(N+1).I_4.I_5$ is P times as large as this current, so that:

$$I_5 = P.((N+1).I_4) \quad (15)$$

Combined with the result of equation (14) this yields:

$$I_3 = (N + P(N+1)).I_4 \quad (16)$$

The current transfer of the circuit shown in FIG. 5 can now be computed by means of equations (6) to (13):

$$I_{out}/I_{in} = 1/(K.M.(N + P(N+1))) \quad (17)$$

Figure 5B:
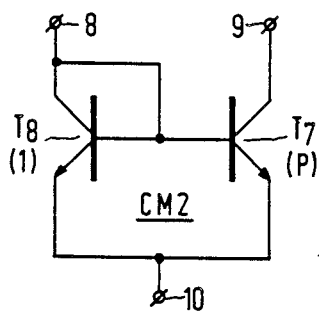
Figure 5C:
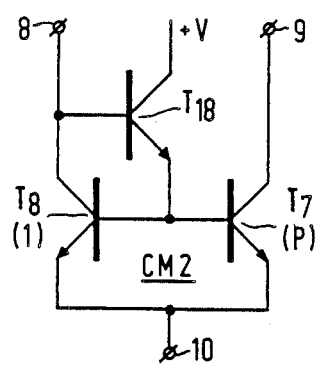

FIGS. 5b and 5c show embodiments of the second current mirror circuit CM2. They are identical to those shown in FIGS. 4b and 4c, except for the fact that the emitter area of the transistor $T_7$ corresponding to the transistor $T_5$ is not N times but P times as large as that of the transistor $T_8$ corresponding to the transistor $T_6$. The current transfer $I_{out}/I_{in}$ is then defined exclusively by the ratios (K, M, N and P) of the dimensions of the transistors used.

Figure 6:
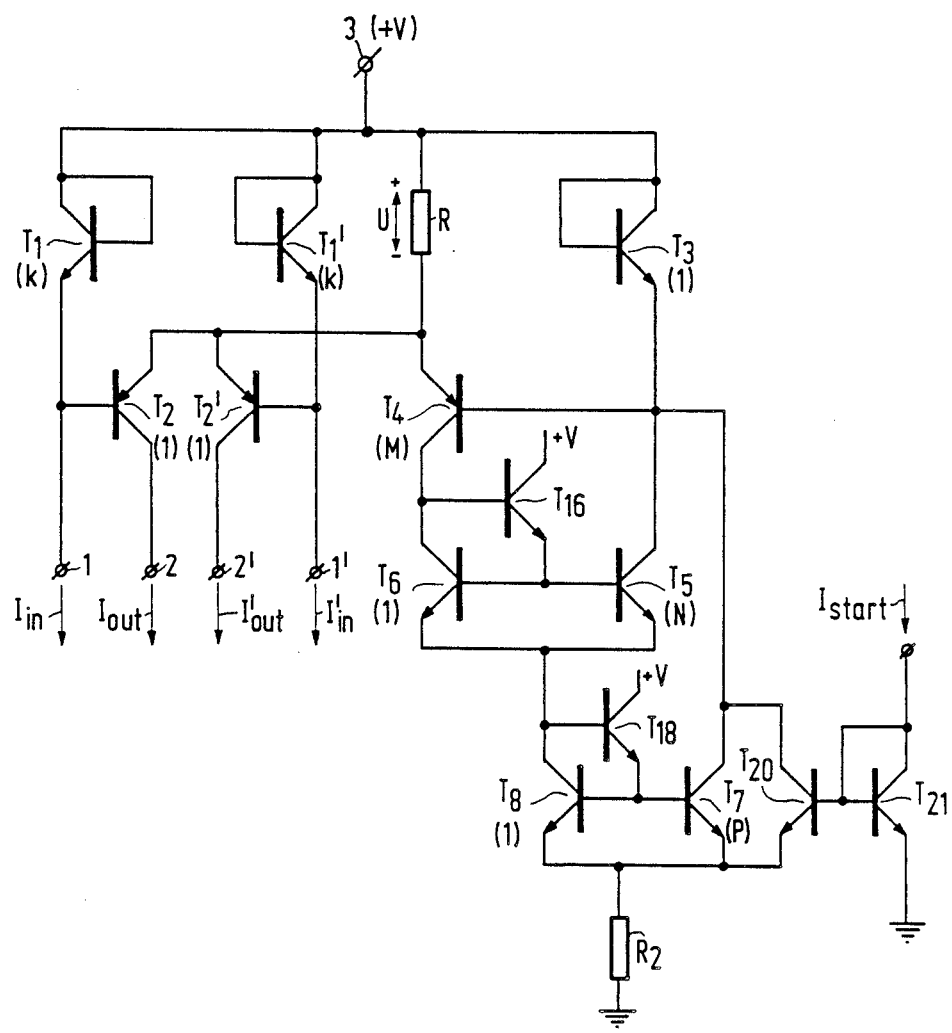
FIG. 6 shows an embodiment of a balanced current amplifier in accordance with the invention.

FIG. 6 shows a balanced version of a current amplifier in accordance with the invention. In this Figure identical or corresponding parts bear the same reference numerals as in FIG. 5 or FIG. 4. Now a second input terminal 1' is provided, in which an input current $I_{in}'$ flows, which terminal is coupled to the junction point between the base of the PNP transistor $T_2'$ and the emitter of a diode-connected NPN transistor $T_1'$, whose collector and base are connected to the common terminal 3. The emitter of the transistor $T_2'$ is connected to the emitter of the transistor $T_2$ and the collector of the transistor $T_2'$ is coupled to an output terminal 2', in which an output current $I_{out}'$ flows. The emitter areas of the transistors $T_2'$ and $T_1'$ are equal to those of the transistors $T_2$ and $T_1$ respectively. The current amplifier shown in FIG. 6 is very suitable for a symmetrical current drive. The input terminals 1, 1' may then be connected, for example, to the outputs of a transconductance circuit in the form of a differential amplifier, the attenuated output currents being available on terminals 2, 2'.

Moreover, in this embodiment the emitters of the transistors $T_7$ and $T_8$ are connected to a suitable supply voltage via a resistor $R_2$. A transistor $T_{20}$ is arranged in parallel with the transistor $T_7$ and constitutes a current mirror in conjunction with the transistor $T_{21}$. A starting current $I_{start}$ in the transistor $T_{21}$ ensures that the current amplifier receives current after the operating voltage (+V) has been applied to the terminal 3. The resistor $R_2$ is dimensioned in such a way that the voltage drop across this resistor causes the transistor $T_{20}$ to cut off as soon as the circuit has become operative. The starting current $I_{start}$ then so longer has any effect. Such a starting circuit may also be used in the other embodiments shown.

Furthermore, it is possible to extend the current amplifiers of FIGS. 3, 4, 5 and 6 by more sets of transistors $T_1$ and $T_2$ and the associated input and output terminals 1 and 2 in a manner as shown in the arrangement of FIG. 6 for the transistors $T_1'$ and $T_2'$. In this way a plurality of attenuating current mirrors are obtained. For the emitter areas of the transistors of these sets it is alternatively possible to select other values than those specified so far. For example, in the arrangement shown in FIG. 6 another value, for example Q, instead of K, may be selected for the transistor $T_1'$ and for the transistor $T_2'$ a value S may be selected instead of 1. This results in a plurality of current mirrors, each having its attenuation factor. From formulas (13) and (17) it appears that the resistance value of the resistor R has no effect on the current gain $I_{out}/I_{in}$. However, care must be taken that the current $I_4$ through the resistor R is always larger than zero for all the values of the output currents.

What is claimed is:

1. A current amplifier comprising an input terminal for receiving an input current, an output terminal for supplying an output current, a first transistor having a base-emitter junction coupled to the input terminal, and a second transistor having a collector coupled to the output terminal and having a base-emitter junction connected in series arrangement with a voltage source which generates a given voltage across its terminals, said voltage source comprising an active element other than the second transistor for generating said given voltage, means connecting said series arrangement in parallel with the base-emitter junction of the first transistor, wherein the first transistor is of the NPN conductivity type and the second transistor is of the PNP conductivity type.

2. A current amplifier as claimed in claim 1, characterized in that it comprises a second current amplifier identical to the first current amplifier, the two current amplifiers having said voltage source in common.

3. A current mirror comprising:
an input terminal,
an output terminal,
a common terminal,
a first diode-connected NPN transistor connected between said input terminal and said common terminal,
a PNP transistor,
a source of DC voltage which generates a given voltage across its terminals, said voltage source comprising an active element other than the PNP transistor for generating said given voltage,
means connecting said DC voltage source and the PNP transistor in series circuit between said output terminal and said common terminal, and
means connecting the base of the PNP transistor to the emitter of the NPN transistor.

4. A current mirror as claimed in claim 3 wherein the voltage source is automatically compensated for temperature changes and for differences in the saturation currents of the PNP and NPN transistors, said voltage source comprising:
a first current mirror circuit including an input terminal, an output terminal and a common terminal,
a resistor connected in said series circuit with the PNP transistor,
a second current mirror circuit including a second diode-connected NPN transistor connected between the output terminal of the first current mirror and the common terminal of the current mirror, a second PNP transistor connected in a series circuit with the resistor between the common terminal of the current mirror and the input terminal of the first current mirror circuit, and means connecting the base of the second PNP transistor to the emitter of the second diode-connected NPN transistor,
and wherein the ratio between the output current and the input current of the first current mirror circuit is equal to a number N, the ratio of the emitter area of the second PNP transistor to the emitter area of the first PNP transistor is equal to a number M, and the ratio of the emitter area of the first diode-connected NPN transistor to the emitter area of the second diode-connected NPN transistor is equal to a number K whereby $$I_{out}/I_{in} = 1/(KMN)$$

where $I_{out}$ and $I_{in}$ are the output current and the input current in the output terminal and the input terminal, respectively, of the current mirror.

5. A current mirror as claimed in claim 4 wherein the first current mirror circuit comprises a third diode-connected NPN transistor connected between its input and common terminals and an NPN transistor connected between its output and common terminals and with the base electrodes thereof connected together.

6. A current amplifier comprising an input terminal for receiving an input current, an output terminal for supplying an output current, a first transistor having a base-emitter junction coupled to the input terminal, and a second transistor having a collector coupled to the output terminal and having a base-emitter junction connected in series arrangement with a voltage source, means connecting said series arrangement in parallel with the base-emitter junction of the first transistor, wherein the first transistor is of the NPN conductivity type and the second transistor is of the PNP conductivity type, wherein the voltage source comprises: a first current mirror circuit having an input terminal for the passage of an input current, an output terminal for the passage of an output current, and a common terminal, the ratio between the output current and the input current of said first current mirror circuit being substantially equal to N, a resistor for supplying the output voltage of the voltage source, a series arrangement of the diode-connected third transistor of the NPN conductivity type and the base emitter junction of a fourth transistor of the PNP conductivity type being connected in parallel with said resistor, said fourth transistor having an emitter area which is substantially M times as large as that of the second transistor, an emitter of the third transistor being coupled to the base of the fourth transistor and to the output terminal of the first current mirror circuit, an input terminal of the first current mirror circuit being coupled to a collector of the fourth transistor, the emitter area of the first transistor being substantially K times as large as that of the third transistor.

7. A current amplifier as claimed in claim 6, wherein the first current mirror circuit comprises a fifth and a sixth transistor, each of the NPN conductivity type, said fifth transistor having an emitter area which is substantially N times as large as that of the sixth transistor, the base-emitter junctions of the fifth and the sixth transistor being connected in parallel, the collector-emitter path of the fifth transistor being connected between the output terminal of the first current mirror circuit and the common terminal of the first current mirror circuit, and the collector-emitter path of the sixth transistor being connected between the input terminal of the first current mirror circuit and the common terminal of the first current mirror circuit.

8. A current amplifier as claimed in claim 7, wherein the voltage source further comprises a second current mirror circuit having an input terminal for the passage of an input current, an output terminal for the passage of an output current, and a common terminal, the ratio between the output current and the input current of said second current mirror circuit being substantially equal to P, the input terminal of the second current mirror circuit being coupled to the common terminal of the first current mirror circuit, and the output terminal of the second current mirror circuit being coupled to the emitter of the third transistor.

9. A current amplifier as claimed in claim 7, characterized in that it comprises a second current amplifier identical to the first current amplifier, the two current amplifiers having said voltage source in common.

10. A current amplifier as claimed in claim 6, wherein the voltage source further comprises a second current mirror circuit having an input terminal for the passage of an input current, an output terminal for the passage of an output current, and a common terminal, the ratio between the output current and the input current of said second current mirror circuit being substantially equal to P, the input terminal of the second current mirror circuit being coupled to the common terminal of the first current mirror circuit, and the output terminal of the second current mirror circuit being coupled to the emitter of the third transistor.

11. A current amplifier as claimed in claim 10, wherein the second current mirror circuit comprises a seventh and an eighth transistor, each of the NPN conductivity type, the emitter area of said seventh transistor being substantially P times as large as that of the eighth transistor, the base-emitter junctions of the seventh and the eighth transistor being connected in parallel, and the collector-emitter path of the seventh transistor being connected between the output terminal of the second current mirror circuit and the common terminal of the second current mirror circuit, and the collector-emitter path of the eighth transistor being connected between the input terminal of the second current mirror circuit and the common terminal of the second current mirror circuit.

12. A current amplifier as claimed in claim 6, characterized in that it comprises a second current amplifier identical to the first current amplifier, the two current amplifiers having said voltage source in common.

* * * * *